(12) United States Patent
Zhaung

(10) Patent No.: US 7,508,056 B2
(45) Date of Patent: Mar. 24, 2009

(54) SURFACE MOUNT HERMETIC PACKAGE FOR POWER SEMICONDUCTOR DIE

(75) Inventor: Weidong Zhaung, Worcester, MA (US)

(73) Assignee: International Rectifier Corporation, El Segundo, CA (US)

( * ) Notice: Subject to any disclaimer, the term of this patent is extended or adjusted under 35 U.S.C. 154(b) by 624 days.

(21) Appl. No.: 11/221,037

(22) Filed: Sep. 7, 2005

(65) Prior Publication Data
US 2006/0055015 A1 Mar. 16, 2006

Related U.S. Application Data

(60) Provisional application No. 60/607,662, filed on Sep. 7, 2004.

(51) Int. Cl.
*H01L 23/02* (2006.01)

(52) U.S. Cl. .................. 257/678; 257/704; 257/730
(58) Field of Classification Search ................ 257/678, 257/701, 704, 730
See application file for complete search history.

(56) References Cited

U.S. PATENT DOCUMENTS 6,630,661 B1 * 10/2003 Hoffman .................. 250/239

* cited by examiner

*Primary Examiner*—Roy K Potter
(74) *Attorney, Agent, or Firm*—Ostrolenk, Faber, Gerb & Soffen, LLP

(57) ABSTRACT

A hermetically sealed AlN housing for power semiconductor die has a rectangular bottom surrounded by a peripheral wall. Spaced conductive plating sections on the top of the bottom section are connected by conductive vias to conductive plated sections on the bottom to enable surface mounting of the device. A ceramic lid is hermetically sealed over the top of the rectangular wall.

21 Claims, 5 Drawing Sheets

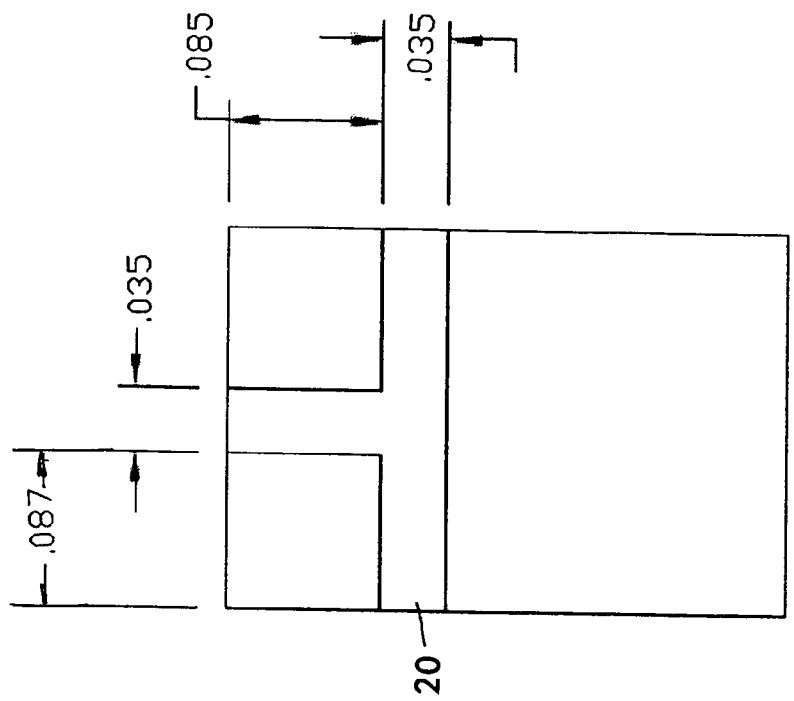
Fig.6
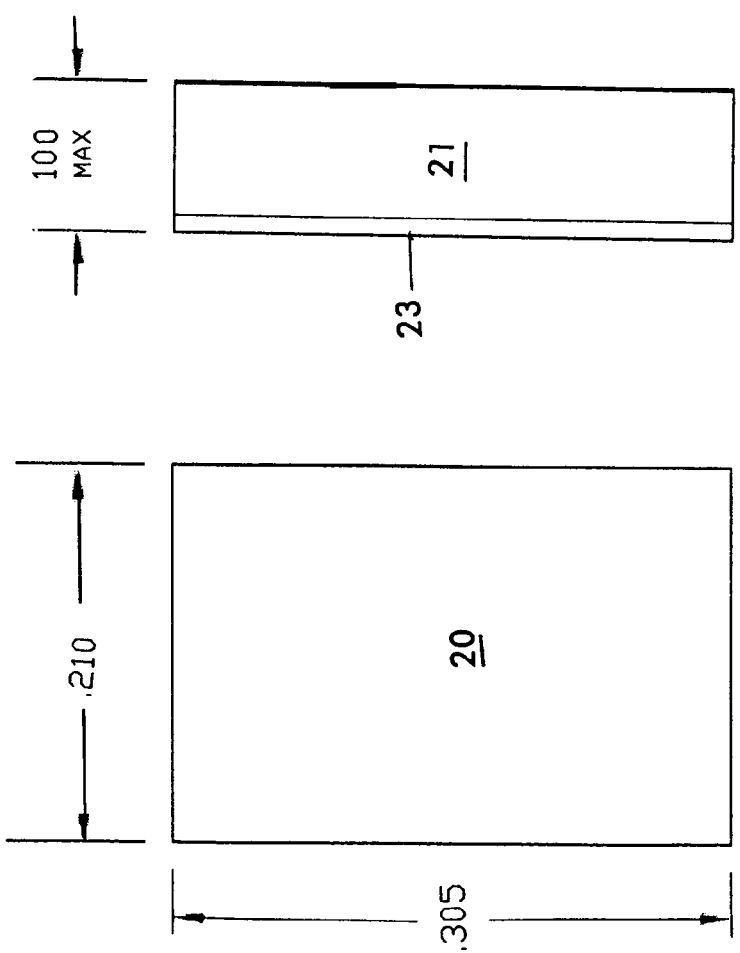
Fig.5
Fig.4

COMMON CATHODE SCHOTTKY 1.5A VOLTAGE REGULATOR

US 7,508,056 B2

SURFACE MOUNT HERMETIC PACKAGE FOR POWER SEMICONDUCTOR DIE

RELATED APPLICATIONS

This application claims the benefit of U.S. Provisional Application No. 60/607,662, filed Sep. 7, 2004.

FIELD OF THE INVENTION

This invention relates to semiconductor devices and more specifically relates to a ceramic package for semiconductor die.

BACKGROUND OF THE INVENTION

High reliability packages for semiconductor devices are known. It is very desirable to make such packages which can be surface mounted and which provide reduced thermal resistance as well as an extremely low electrical resistance.

BRIEF DESCRIPTION OF THE INVENTION

In accordance with the invention a hermetically sealed housing is formed of an AlN ceramic package. The package bottom has solid conductive vias extending therethrough to connect conductive plating areas on the upper surface of the package bottom to matching conductive plating areas on the bottom surface of the housing bottom. A wall extending from the periphery of the package bottom can be sealed by a ceramic lid.

A power semiconductor die is mounted within the package and its bottom electrode is soldered or otherwise conductively connected to a first plated section, while the top electrode of the die is wire bonded to a second plated section on the top surface of the package bottom.

The AlN material provides an ultra low junction to case thermal resistance, whereas the solid vias maintain an extremely low electrical resistance.

The package size of a preferred embodiment is 0.305"× 0.210" 0.100". A ceramic lid may be used and sealed to a Kovar ring on the top of the case wall.

BRIEF DESCRIPTION OF THE DRAWINGS

FIGS. 4, 5 and 6 are package outline drawings of the housing of the invention and are top, side and bottom views, respectively.

DETAILED DESCRIPTION OF THE PREFERRED EMBODIMENT

Figure 1:
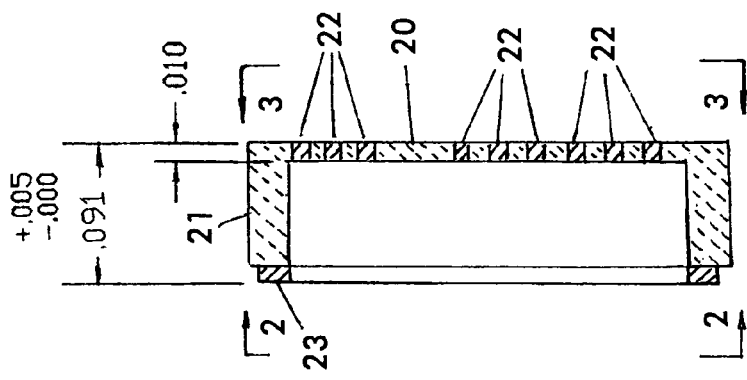
FIG. 1 is a cross-section through the AlN housing before conductive coatings are applied thereto.

FIG. 1 shows, in cross-section the housing of the invention, before metallization. The housing consists of a bottom section 20 and a wall 21 extending from the outer periphery of bottom section 20. A plurality of via openings extend through bottom section 20 and are filled with solid conductors 22 in the desired contact pattern. A Kovar O-ring 23 is fixed to the top of the wall 21. The bottom section 20 and wall 21 are integrally formed of cofired AlN, an insulation ceramic (170 W/mKmin.)

Preferred package dimensions are shown in FIGS. 1 to 6, it being understood that these can be changed as desired.

Figure 3:
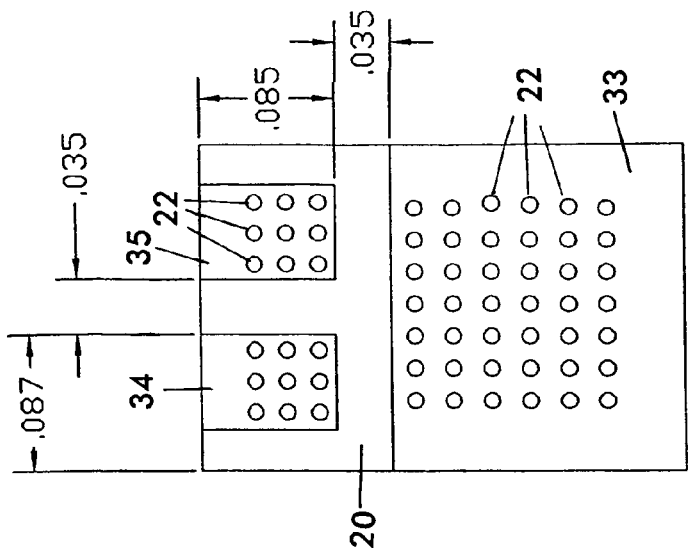
FIG. 3 is a view of FIG. 1 as seen from section line 3-3 after conductive regions have been plated on the bottom of the housing to enable surface mounting.
Figure 2:
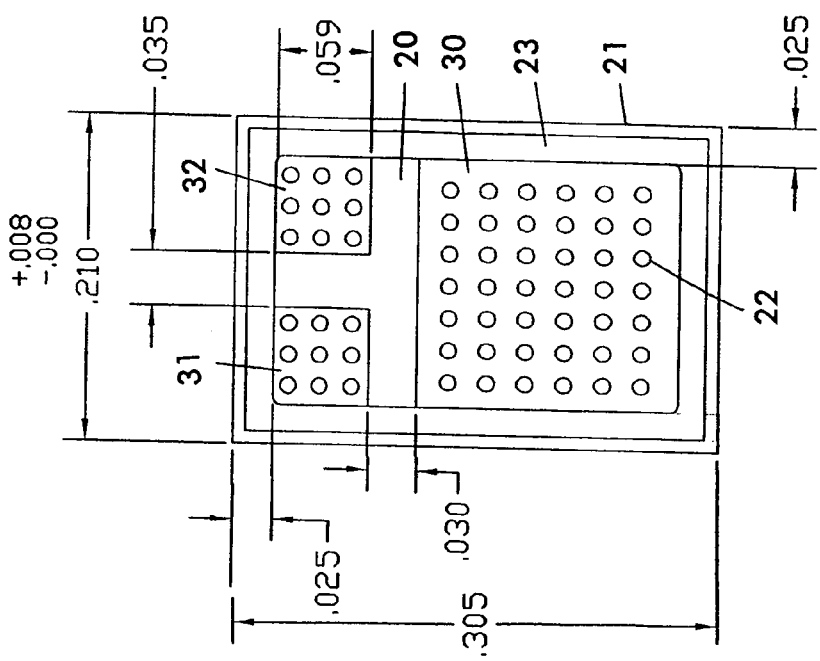
FIG. 2 is a view of FIG. 1 as seen from section lines 2-2 after conductive regions have been plated on the bottom interior of the housing.

Bottom section 20 is then metallized with spaced and insulated metallizations 30, 31 and 32 on its top surface as shown in FIG. 2 and with aligned metallizations 33, 34 and 35 on its bottom surface as shown in FIG. 3. The top and bottom metallizations are electrically connected by the vias.

The metallizations 30 to 35 are formed of 60 microns or more of plated Au over about 80 microns of plated Ni/Ni/Co. Other metallizations can be used and are solderable, capable of accepting solder 60/40 void free 95% of the area per MIL-STD-750-METHOD 2026.

Figure 7:
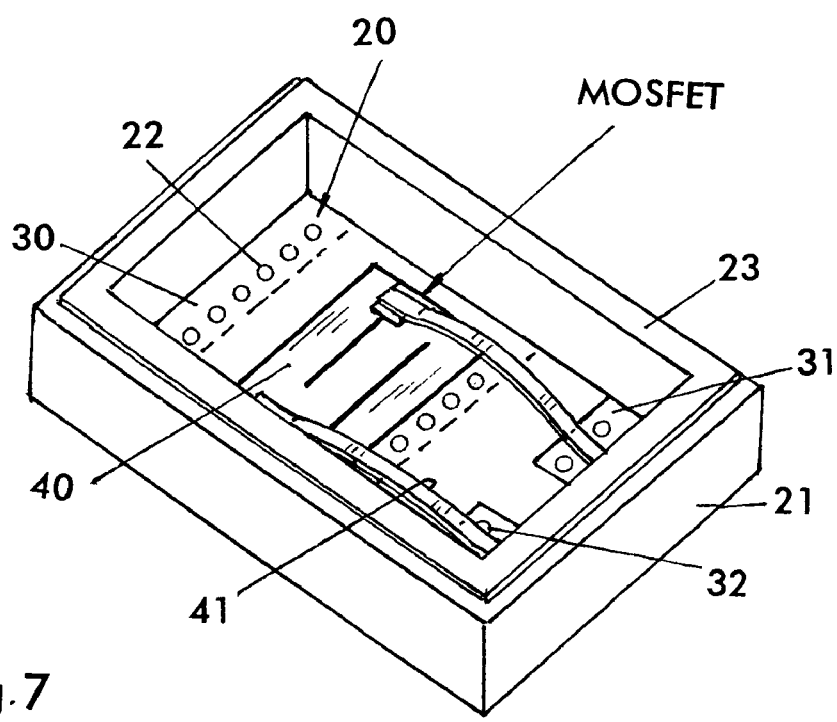
FIGS. 7, 8, 9 and 10 are perspective views of the housing of FIGS. 1 to 6 receiving a MOSFET die, a single Schottky die, Schottkys with a common cathode, and a 1.5 amp voltage regulator, respectively.
Figure 11:
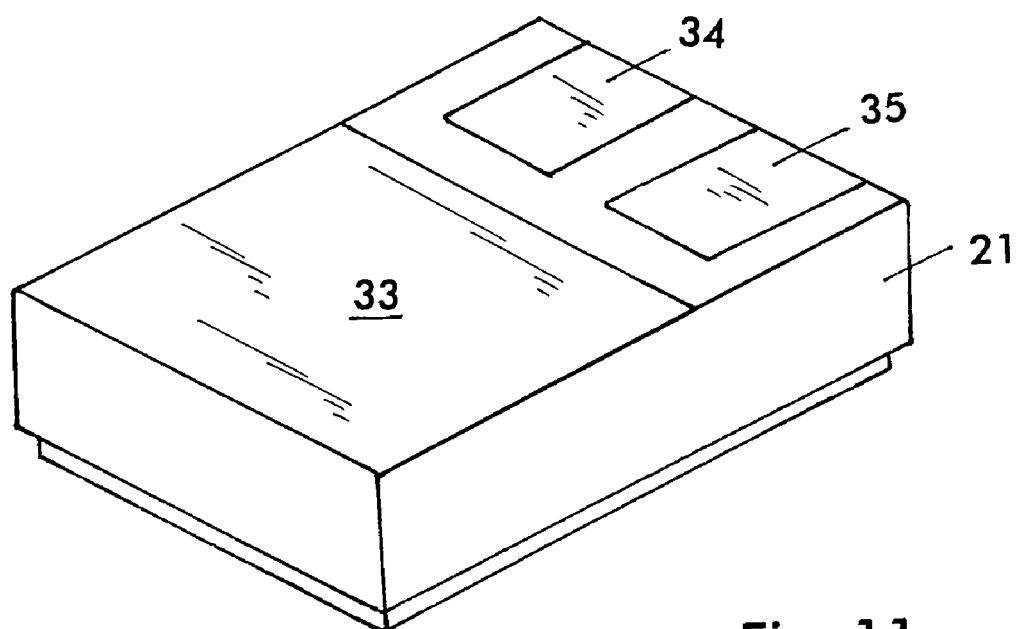
FIG. 11 is a bottom perspective view of the assembled package of the invention.
Figure 12:
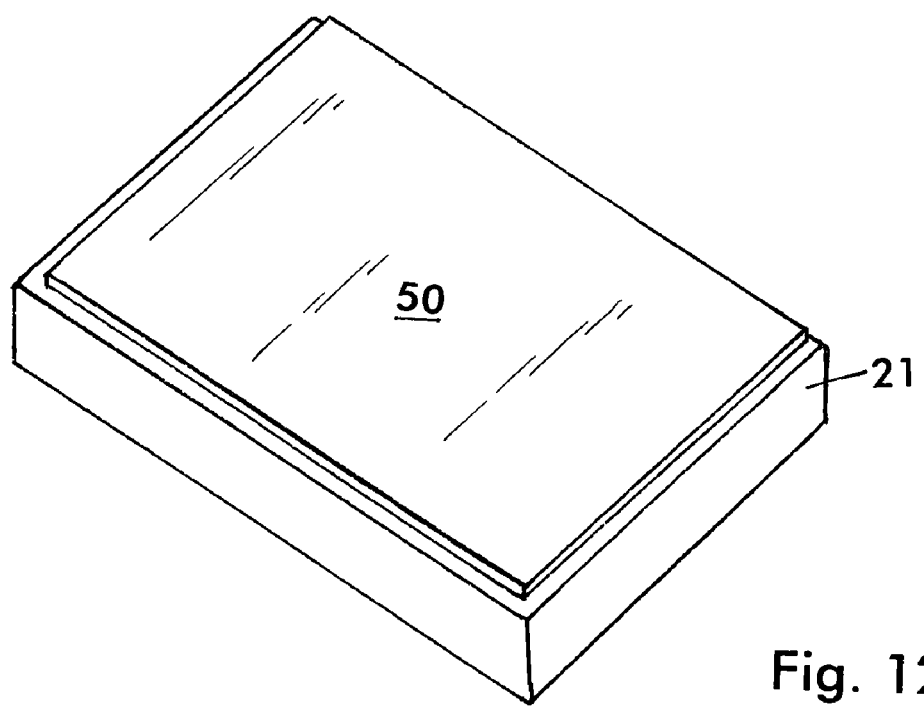
FIG. 12 is a top perspective view of the assembled package of the invention.

FIG. 7 shows the housing of FIGS. 1 to 6, receiving a size 2 vertical conduction MOSFET 40. The bottom drain electrode of MOSFET 40 is soldered to electrode 30. Its top source electrode is wire bonded by wire 41 to metallizing 32 and its gate electrode is wire bonded to metallizing 31. The housing may be sealed closed by an AlN lid 50 (FIG. 12) which is sealed to the Kovar ring 23. Note that the drain, source and gate electrodes are connected, by vias 22 to the electrodes 33, 34 and 35 (FIG. 11) so the package can be surface mounted.

Figure 8:
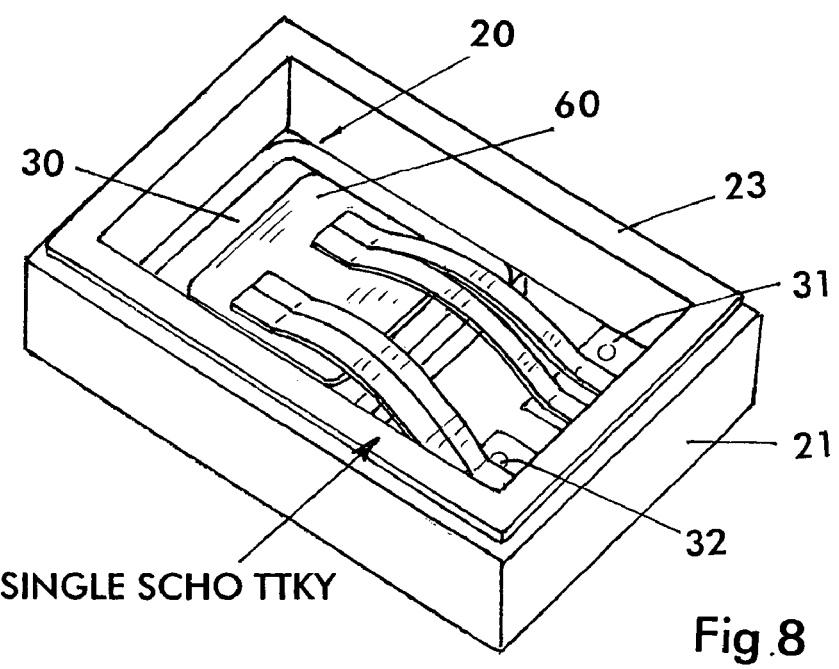

Any other semiconductor die with a power electrode on its bottom can be similarly mounted within the housing, with top electrodes bonded to other metallizing. Thus, in FIG. 8, a Schottky diode 60 has its bottom electrode soldered to metallizing 30 and its top electrode is wire bonded to metallizing 31 and 32.

Figure 9:
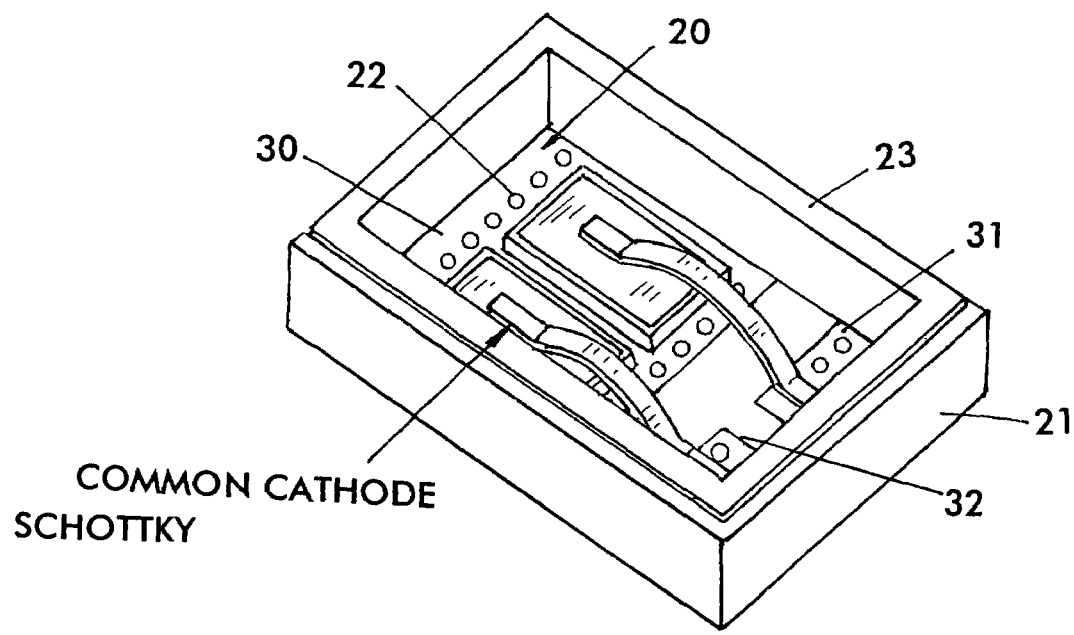

As shown in FIG. 9, two Schottky diodes 70 and 71 have their common cathode connected to metallizing 30 (and thus to 33) and are separately wire bonded to metallizing 31 and 32, and thus metallizing 35 and 34, respectively.

Figure 10:
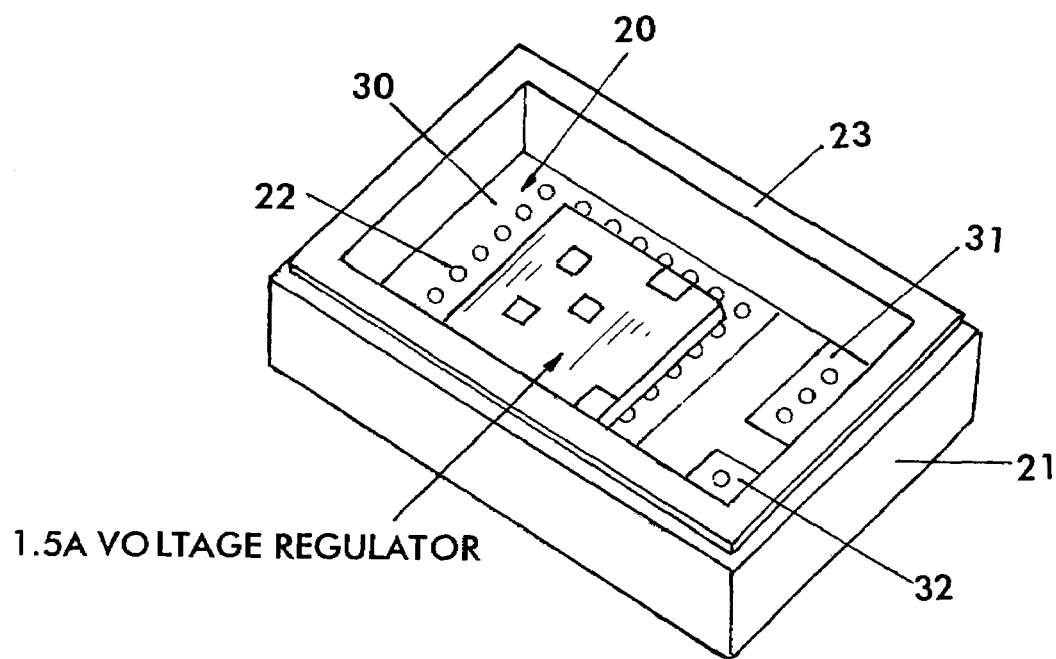

The package may also receive power integrated circuits as shown for the 1.5 amp voltage regulator die 80 in FIG. 10.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A ceramic housing for semiconductor die; said ceramic housing comprised of a ceramic material having a cup shape formed by a bottom planar section and a wall extending perpendicularly upward from the periphery of said bottom section; said bottom section having an interior surface within said wall and an exterior surface; first and second spaced and insulated conductive coatings on said interior surface and first and second spaced and insulated conductive coatings on said exterior surface and in registry with said first and second coatings on said interior surface respectively; a ceramic lid comprised of said ceramic material hermetically sealed to said wall; and a plurality of conductive vias extending perpendicularly through said bottom section and electrically connecting said first and second coatings on said interior surface to said first and second coatings on said bottom surface.

2. The structure of claim 1, wherein said ceramic material is AlN.

3. The structure of claim 1, wherein said bottom section is rectangular.

4. The structure of claim 2, wherein said bottom section is rectangular.

5. The structure of claim 1, wherein the free top of said wall has a Kovar ring secured thereto.

6. The structure of claim 4, wherein the free top of said wall has a Kovar ring secured thereto.

7. The structure of claim 5, wherein said ceramic lid is hermetically sealed to said Kovar ring.

8. The structure of claim 7, wherein said ceramic material is AlN.

9. The structure of claim 8, wherein said bottom section is rectangular.

10. The structure of claim 1, which further includes a semiconductor die positioned within said walls of said housing and atop said bottom section; said semiconductor die having top and bottom power electrodes on its opposite surfaces; said bottom electrode being conductively secured to said first conductive coating on said interior surface of said bottom section; said top electrode being wire bonded to said second conductive coating on said interior surface of said bottom section.

11. The structure of claim 10, wherein said semiconductor die is a power MOSFET.

12. The structure of claim 10, wherein said semiconductor die is a power diode.

13. The structure of claim 10, wherein said ceramic material is AlN.

14. The structure of claim 10, wherein said bottom section is rectangular.

15. The structure of claim 10, wherein the free top of said wall has a Kovar ring secured thereto.

16. The structure of claim 15, wherein said ceramic lid is hermetically sealed to said Kovar ring.

17. The structure of claim 4, wherein said bottom surface has a length of about 0.3 inch and a width of about 0.2 inch and a thickness of about 0.01 inch, and wherein said wall has a height of about 0.09 inch.

18. The structure of claim 6, wherein said bottom surface has a length of about 0.3 inch and a width of about 0.2 inch and a thickness of about 0.01 inch, and wherein said wall has a height of about 0.09 inch.

19. The structure of claim 15, wherein said bottom surface has a length of about 0.3 inch and a width of about 0.2 inch and a thickness of about 0.01 inch, and wherein said wall has a height of about 0.09 inch.

20. The structure of claim 17, wherein said first conductive coating on said interior surface has the shape of a square which is about 0.05 inch less than said width of said bottom section on a side, and wherein said second conductive coating on said interior surface is a square about 0.06 inch on a side.

21. A ceramic housing for semiconductor die; said ceramic housing having a cup shape formed by a bottom planar section and a wall extending perpendicularly upward from the periphery of said bottom section; said bottom section having an interior surface within said wall and an exterior surface; first and second spaced and insulated conductive coatings on said interior surface and first and second spaced and insulated conductive coatings on said exterior surface and in registry with said first and second coatings on said interior surface respectively; and a plurality of conductive vias extending perpendicularly through said bottom section and electrically connecting said first and second coatings on said interior surface to said first and second coatings on said bottom surface; wherein the free top of said wall has a Kovar ring secured thereto.

* * * * *